United States Patent [19]
Van Der Sanden et al.

[11] Patent Number: 5,999,442
[45] Date of Patent: Dec. 7, 1999

[54] SEMI-CONDUCTOR DEVICE WITH A MEMORY CELL

[75] Inventors: Cornelis G.L.M. Van Der Sanden; Johannes A.J. Van Geloven, both of Eindhoven, Netherlands

[73] Assignee: U.S. Philips Corporation, New York, N.Y.

[21] Appl. No.: 09/264,946

[22] Filed: Mar. 9, 1999

[30] Foreign Application Priority Data

Mar. 18, 1998 [EP] European Pat. Off. .............. 98200866

[51] Int. Cl.$^6$ .................................................. G11C 11/00
[52] U.S. Cl. ........................................... 365/154; 365/156
[58] Field of Search ..................... 365/154, 156

[56] References Cited

U.S. PATENT DOCUMENTS

| | | | |
|---|---|---|---|
| 3,662,356 | 5/1972 | Michon et al. | 365/154 |
| 4,805,148 | 2/1989 | Dichi-Nagle et al. | 365/154 |
| 5,450,353 | 9/1995 | Koike | 365/154 |
| 5,600,588 | 2/1997 | Kawashima | 365/154 |
| 5,708,509 | 1/1998 | Sato et al. | 365/154 |

*Primary Examiner*—Trong Phan
*Attorney, Agent, or Firm*—Brian J. Wieghaus

[57] ABSTRACT

A memory cell contains a cross-coupled pair of a first and second transistor. The voltage of the drains are operated in a range between a first and second supply voltage. The back-gates of the first and second transistor are coupled to the connection for the first supply voltage. The device contains a circuit arrangement for deriving a source lying between the voltage of the back-gates and the second supply voltage. The circuit arrangement keeps sources of the first and second transistor at the source voltage.

7 Claims, 2 Drawing Sheets

SEMI-CONDUCTOR DEVICE WITH A MEMORY CELL

BACKGROUND OF THE INVENTION

The invention relates to a semi-conductor device as set forth in the precharacterizing part of claim 1. Such a device is known from a publication by K. L. Anderson and L. M. Arzubi in the IBM technical disclosure bulletin Vol. 17, No. 6, November 1974 pages 1567, 1568.

This device uses a so-called 4T dynamic memory cell, that is, a dynamic memory cell which uses a cross-coupled pair of NMOS transistors for storing information and two NMOS access transistors for accessing the stored information. In the cross coupled pair, the gate of a first transistor is coupled to the drain of a second transistor and vice versa. The sources of the transistors are connected to each other.

This dynamic memory cell may be contrasted with a conventional 1T dynamic memory cell, that is, a memory cell with a storage capacitor and one access transistor for accessing information stored on the capacitor. A 4T memory cell allows a faster access and shorter cycle time than the 1T dynamic memory cell. On the other hand, a 4T memory cell requires a larger amount of substrate area for transistors than the 1T memory cell, but this is set-off by the fact that for use in a memory matrix the 1T memory cell needs a relatively large capacitor, which is not the case for a 4T memory cell. This makes it attractive to use 4T memory cells without such relatively large capacitors, especially in semi-conductor manufacturing processes that are not especially optimized for manufacturing memory capacitors, e.g. "logic" manufacturing processes designed for manufacturing signal processors, micro-controllers etc.

However, the use of a 4T memory cell without a relatively large memory capacitor has the disadvantage that leakage currents in the memory cell are more prominent, leading to a shorter retention time. The publication by Anderson et al. counters this problem by boosting the voltage that is stored in the memory cell. However, this puts special requirements on the voltage handling capability of the transistors, it complicates the circuit and provides only small gain.

SUMMARY OF THE INVENTION

Amongst others, it is an object of the invention to increase the retention time of a memory cell in a semi-conductor device according to the preamble without using a boosted drain voltage.

The semi-conductor device according to the invention is characterized by the characterizing part of claim 1. When the first and second transistor are NMOS or PMOS transistors the voltage at the source of the cross-coupled transistors is raised or lowered, respectively, relative to the voltage of the first supply voltage, which is the voltage to which the back-gates of the cross-coupled transistors are connected. Thus, the sub-threshold leakage current through the cross-coupled transistors is reduced and the retention time is consequently increased. This technique is especially suitable for logic circuits with embedded memory, where the NMOS transistors used for logic function also have their back-gates connected to the connection for the first supply voltage.

An embodiment of the semi-conductor device according to the invention is described in claim 2. By using a common connection for the sources of the transistors of a number of memory cells the amount of circuit area per cell is reduced.

The invention is primarily directed at dynamic memory cells, where there is no coupling between the connection for the second supply voltage and the drains of any one of the first and second transistor when the memory cell is not accessed, or at least only such a parasitic coupling that the leakage current through a non-conductive one of the first and second transistor is larger than any charging current to the drain of that transistor from the connection for the second supply voltage. However, the invention may also be useful in static memory cells, where there are PMOS transistors in the memory cell between the drains and the connection for the second supply voltage. In this case the invention reduces power consumption.

The circuit arrangement may be implemented as described in claim 5. In the case of NMOS first and second transistors the channel of a PMOS transistor may be arranged between the connection for the first power supply and the sources of the first and second transistor, the gate of the PMOS transistor being connected to the connection for the first power supply. Thus, the raised voltage at the sources of the first and second transistor is easily realized.

The invention is particularly suitable for logic integrated circuits with embedded memory, containing for example logic circuits like a micro-controller or a signal processor, where most NMOS transistors in the logic circuits have their source and backgate connected in common to the connection for the first power supply (as far as these transistors have their source connected to a fixed voltage).

BRIEF DESCRIPTION OF THE DRAWINGS

These and other advantageous aspects of the invention will be described using the following figures. In the figures

DESCRIPTION OF THE PREFERRED EMBODIMENTS

Figure 1:
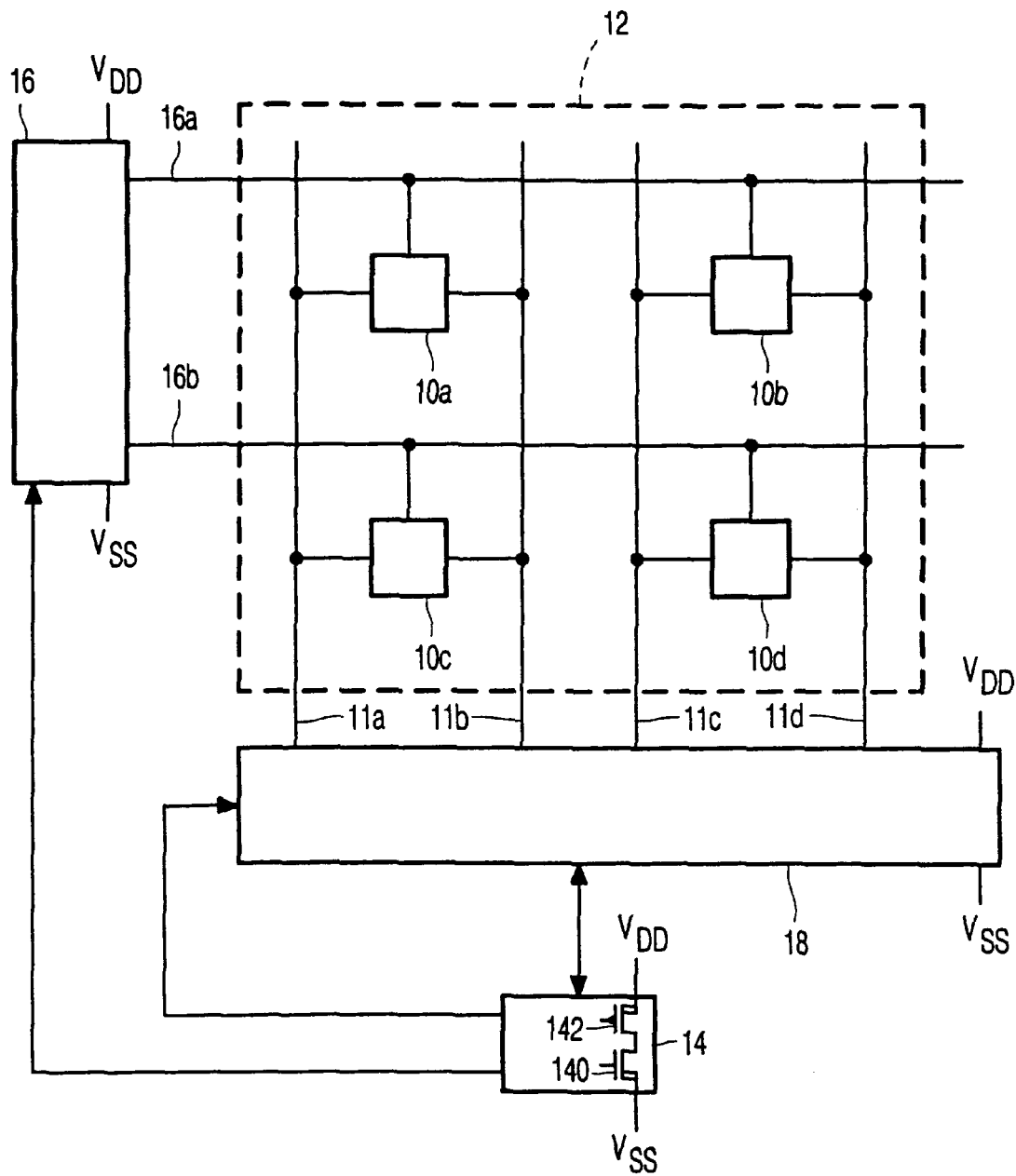
FIG. 1 shows a schematic of a semi-conductor device with a memory

FIG. 1 shows a schematic of a semi-conductor device with a memory. The device contains a memory matrix 12, logic circuits 14, row addressing circuits 16 and column accessing circuits 18. The logic circuits 14 contain for example the circuitry of a micro-controller (not shown) or a digital signal processor (not shown). Typically the device is a processor with embedded memory and all these circuits are combined on the same semi-conductor substrate.

The logic circuits 14 have address outputs coupled to the row addressing circuits 16 and the column accessing circuits 18, and a data input/output coupled to the column accessing circuits 18. The row addressing circuits 16 are coupled to row lines 16a,b. The column accessing circuits 18 are coupled to pairs of bit-lines 11a–d. The memory matrix contains memory cells 10a–d arranged in rows and columns (2 rows and 2 columns for reasons of clarity, but of course a much larger number of rows and columns will be used in practice). The memory cells 10a–d of each row are connected to a respective one of the row lines 16a,b. The memory cells 10a–d of each column are connected to a respective one of the pairs of bit-lines 11a–b, 11c–d.

The semi-conductor device has connections for supply voltages VDD and VSS. These connections are shown connected to logic circuits 14, row addressing circuits 16 and column accessing circuits 18. Generally speaking, these circuits 14, 16, 18 contain NMOS transistors and PMOS transistors with main current channels connected between the connections for VDD and VSS. The NMOS and PMOS transistors have back-gates (bulk or well) connected to VSS and VDD respectively. This ensures that the source-bulk/well diodes and the drain-bulk/well diodes of these transistors are not forward biased. By way of example the supply voltage connections of an NMOS transistor 140 and a PMOS transistor 142 in the logic circuits 14 are shown: the NMOS transistor 140 has source and back-gate connected to VSS, the PMOS transistor 142 has source and back-gate connected to VDD.

In operation, the logic circuits 14 process data and read and write intermediate results from or to the memory matrix 12. If the logic circuits 14 require access to a memory cell, they will supply a row address to the row addressing circuits 16 and a column address to the column accessing circuits 18. The row address will cause the row addressing circuits to activate an addressed one of the row lines 16a,b, which in turn will cause each memory cells 10a–d connected to that row line 16a,b to output data to the bit-line pair 11a–d to which that memory cell 10a–d is connected. The column address will cause the column accessing circuit 18 to access on addressed one of the line pairs 11a–d and to read or write data from or into the memory cell 10a–d at the cross-point of the addressed row and column and supply it to or from the logic circuits 14. This mode of access is described by way of example only. Without deviating from the invention other modes of access may be used: access to all columns in parallel or to a number of columns making up a word of information etc.

Figure 2:
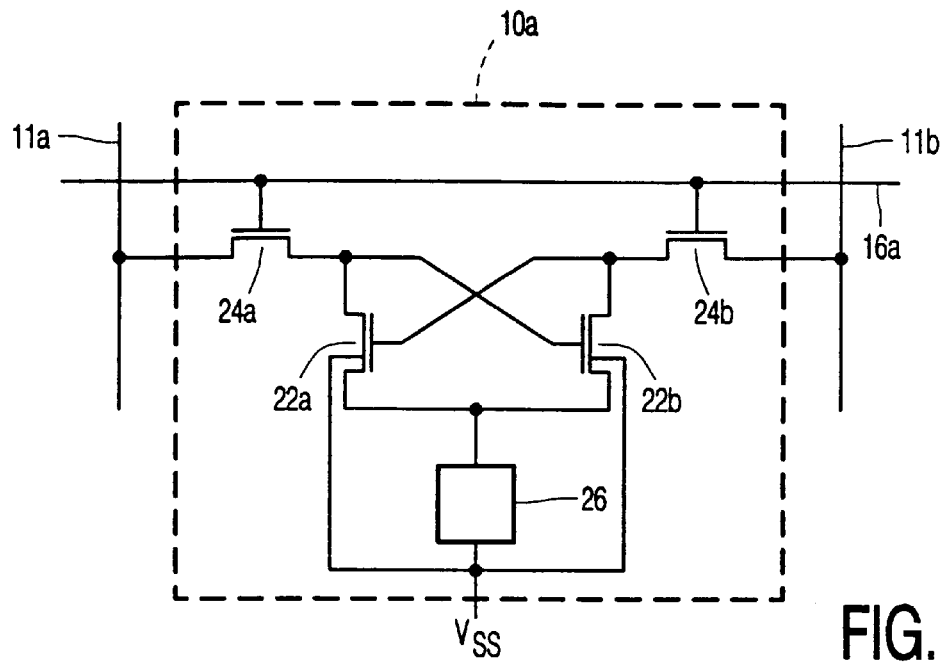
FIG. 2 shows a memory cell

FIG. 2 shows a memory cell 10a; the other cells 10b–d are identical to this memory cell 10a. The memory cell 10a contains a cross-coupled first and second storage transistor 22a,b of NMOS conductivity type, a first and second access transistor 24a,b of NMOS conductivity type and a first terminal of the source supply circuit 26. The sources of the first and second storage transistor 22a,b are coupled to each other and to the source supply circuit 26. The gate of the first storage transistor 22a is coupled to the drain of the second storage transistor 22b and vice versa. The drain of the first storage transistor 22a is coupled to a first bit-line 11a of a bit-line pair via the main current channel of the first access transistor 24a. The drain of the second storage transistor 22b is coupled to a second bit-line 11b of the bit-line pair via a main current channel of the second access transistor 24b. The gates of the first and second access transistor are coupled to a word line 16a. The back-gates of the first and second storage transistor 22a,b are coupled to the connection for the first supply voltage VSS together with a second terminal of the source supply circuit 26.

In operation the memory cell 10a is brought in one of two storage states, representing a logic true and false value of a bit respectively. In a first storage state the gate voltage of the first storage transistor 22a is more than a threshold above the voltage at the sources and the gate voltage of the second storage transistor 22b is substantially at the voltage of the sources. Hence, the first storage transistor 22a is conductive and the second storage transistor 22b is non-conductive. In a storage second state the roles of the first and second storage transistor 22a,b are interchanged with respect to the first storage state.

In a quiescent state of the memory cell 10a the row line 16a is at a low voltage. This makes the access transistors 24a,b non-conductive and allows the memory cell 10a to retain its storage state. When the row to which the memory cell 10a belongs is accessed, the voltage of the row line 16a is raised, making the access transistors 24a,b conductive. In case of write into the memory cell 10a, a voltage is placed on the bit lines 11a,b forcing the memory cell 10a to assume one of its storage states. Preferably, the W/L ratio's of storage transistors 22a,b is selected to be at least so large that these transistors latch any data on the bit-lines 11a,b during access. In case of read from the memory cell the conductive one of the first and second storage transistors 22a,b is allowed to pull its bit-line 11a,b low.

In the quiescent state the memory cell 10a suffers from leakage, mostly through storage transistors 22a,b because these are usually much larger than the access transistors 24a,b. The non-conductive one of the storage transistors 22a,b will conduct slightly, causing the voltage at its drain to diminish. If the voltage at this drain diminishes too much both storage transistors 22a,b will become non-conductive, causing the logic value of the memory cell 10a to be lost. To prevent this from happening, the device will have to regularly refresh the content of the memory cell 10a–d, for example by reading its content and writing this content anew. The maximum allowable time between successive refresh operations is determined by the leakage current. It is therefore desirable that this leakage current is as small as possible.

The leakage current is reduced by means of source supply circuit 26. Source supply circuit 26 raises the voltage at the sources of the first and second storage transistor 22a,b above the voltage of the back gates of these storage transistors 22a,b, that is, it allows the voltage at the sources to assume a voltage between the first and second supply voltage, whereas the back gates are kept substantially at the first supply voltage. As a result, the drain of the conductive one of the storage transistors 22a,b will also be at the raised voltage as will the gate of the non-conductive one of the storage transistors 22a,b. This leads to a substantially lower sub-threshold leakage current through the non-conductive one of the storage transistors 22a,b, because the sub-threshold leakage current is exponentially proportional to the voltage difference between the voltage at the gate and the voltage at the backgate of the non-conductive storage transistor 22a,b.

For example, when the difference between the first and second supply voltage VSS, VDD is 3 volts, the voltage at the sources may be raised to 1 volt above the voltage of the first supply voltage VSS.

Thus, the voltage at the sources of the storage transistors 22a,b is higher than the voltage VSS at the sources of NMOS transistors that have a fixed voltage at their source in the logic circuits 14, the row addressing circuit 16 and the column accessing circuit 18 (including sense amplifiers for the bit lines and write circuits for the bit-lines).

In this respect it should be noted that raising the voltage at the sources of the storage transistors 22a,b from the first supply voltage in the direction of the second supply voltage in itself reduces the amount of charge stored on the drain of the non-conductive one of the storage transistors 22a,b. This is because the voltage difference between the logical TRUE and FALSE state of the memory becomes smaller. In itself, this would reduce the amount of time that the memory cell 10a can hold information before it must be refreshed. However, it has been found that this reduction is more than compensated for by the reduction in leakage current that is achieved in this way. For example, with a supply voltage difference of 3V, a source voltage 1V above the first power supply voltage an improvement in retention time of a factor 15 could be realized at 125° C. operating temperature.

As shown in FIG. 2 the sources of the first and second storage transistor 22a,b are connected to each other. One source supply circuit 26 supplies the source voltage to both sources, but of course one might also keep the sources disconnected and use different voltage sources to supply voltage to the sources of the first and second transistor 22a,b respectively.

Figure 3:
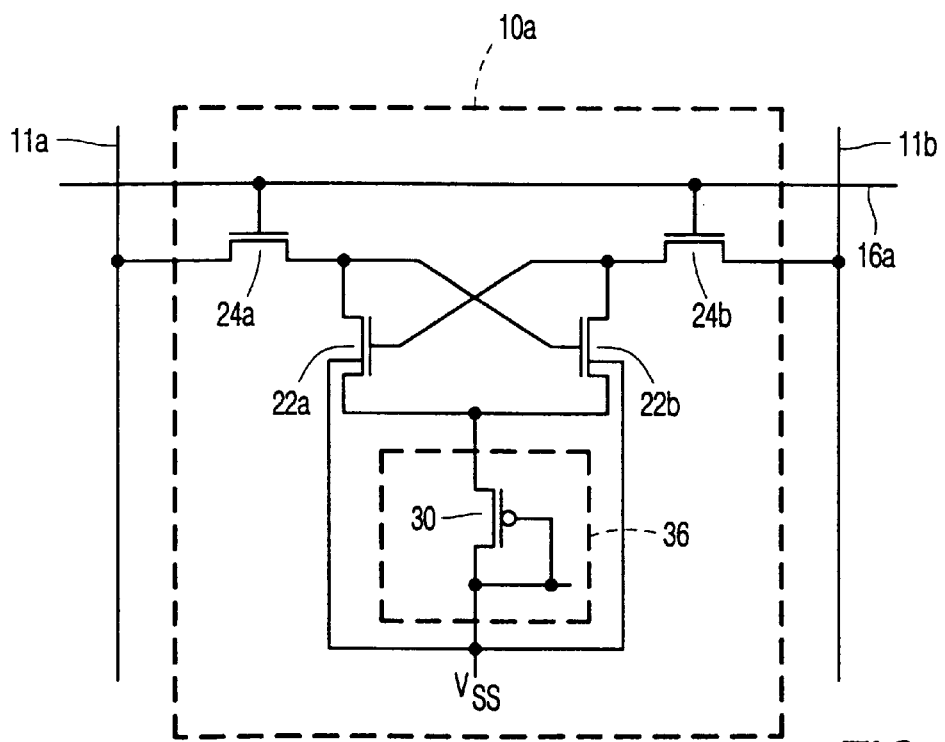
FIG. 3 shows a further memory cell

FIG. 3 shows a memory cell 10a with a specific source supply circuit 36. Otherwise the components of the memory cell 10a are the same as that of FIG. 2 and the same reference numerals are used. The source supply circuit 36 contains a PMOS transistor 30 having a main current channel connected between the connection for the first supply voltage VSS and the sources of the storage transistors 22a,b.

In operation the gate of the PMOS transistor 30 is kept for example at the VSS level. In this case, the voltage at the sources of the storage transistors 22a,b will assume a voltage one PMOS threshold (including back-bias effect) above the first supply voltage VSS, that is approximately 1 Volt above VSS when the memory cell is accessed via the bit-lines 11a,b.

It is possible but not necessary that different source supply circuits 26, 36 are used for different memory cells. Instead a common source supply circuit 26, 36 may be used for the entire memory matrix or a respective one for each row of memory cells. Thus, the semi-conductor substrate surface area per memory cell required for the source supply circuit 26, 36 can be kept low.

We claim:

1. A semiconductor device comprising
    connections for a first and second supply voltage, respectively;
    a memory cell with cross-coupled pair of a first and second transistor, gates of the first and second transistor being coupled to drains of the second and first transistor respectively, the device operating potentials of the drains being in a range between the first and second supply voltage, characterized in that:
        back-gates of the first and second transistor are coupled to the connection for the first supply voltage and that the device contains a source supply circuit, coupled to the first supply voltage and the sources of the first and second cross-coupled transistors, which derives a source voltage from the first and second supply voltage, the source voltage lying between the voltage of the back-gates and the second supply voltage, the source supply circuit keeping sources of the first and second transistor at the source voltage.

2. A semiconductor device according to claim 1, comprising a matrix of memory cells arranged in rows and columns, each memory cell in the matrix being identical to said memory cell, the sources of the transistors from at least two of the memory cells all being connected in common, the source supply circuit keeping the sources of first and second transistors of the at least two of the memory cells at the source voltage.

3. A semiconductor device according to claim 1, the at least two memory cells including a row of memory cells.

4. A semiconductor device according to claim 1, wherein an effective impedance between the drains of the first and second transistor and the connection for the second supply voltage when no access occurs to the memory cell is at least so high that leakage currents from the drains of the first and second transistors to the connection for the first supply voltage are greater than any current from the connection for the second supply voltage to the drains when no access occurs.

5. A semiconductor device according to claim 1, wherein the source supply circuit comprises a third transistor, of a conductivity type complementary to a conductivity type of the first and second transistor, a main current channel of the third transistor being coupled between the connection for the first power supply and the sources of the first and second transistor, a gate of the third transistor being coupled to the first supply voltage.

6. A semiconductor device according to claim 1, containing logic circuits with transistors having their sources and back gates connected to the connection for the first supply voltage, and a memory access interface between the logic circuits and the memory cell for reading and writing logic results produced by the logic circuits to or from the memory cell.

7. A semiconductor device according to claim 6, wherein said logic circuits include a micro-processor or signal processor.

* * * * *